(12) United States Patent
Xu et al.

(10) Patent No.: US 7,276,746 B1
(45) Date of Patent: Oct. 2, 2007

(54) METAL-OXIDE-SEMICONDUCTOR VARACTORS

(75) Inventors: Yanzhong Xu, Santa Clara, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 151 days.

(21) Appl. No.: 11/169,070

(22) Filed: Jun. 27, 2005

(51) Int. Cl.
*H01L 29/80* (2006.01)
*H01L 31/112* (2006.01)

(52) U.S. Cl. ...................................... 257/258; 257/199
(58) Field of Classification Search ................. 257/199, 257/258, 369, 371, 500, 550
See application file for complete search history.

(56) References Cited

U.S. PATENT DOCUMENTS 6,376,870 B1 * 4/2002 Carpenter et al. .......... 257/288
6,764,891 B2   7/2004 Altmann
6,825,089 B1   11/2004 Shapira et al.

* cited by examiner

*Primary Examiner*—Phuc T. Dang
(74) *Attorney, Agent, or Firm*—G. Victor Treyz

(57) ABSTRACT

Integrated circuit varactors and methods for varactor fabrication are provided. Varactors are formed on integrated circuits that contain complementary metal-oxide-semiconductor (CMOS) transistors. The same semiconductor fabrication process steps are used to form both the varactors and CMOS transistors, thereby eliminating potentially cost-prohibitive changes to manufacturing process flows. Varactor performance is enhanced by including a deep n-well structure. The deep n-well reduces sheet resistance in the semiconductor portion of the varactor and improves the varactor's quality factor. The deep n-well is formed from the same deep n-well layer that is used to form the CMOS transistors on the integrated circuit. The varactor has two active electrodes. The electrodes are spaced farther apart than specified by semiconductor fabrication design rules. The number of contact vias used in one of the electrodes is less than the maximum specified by the design rules.

7 Claims, 14 Drawing Sheets

METAL-OXIDE-SEMICONDUCTOR VARACTORS

BACKGROUND

This invention relates to varactors, and more particularly, to metal-oxide-semiconductor varactors fabricated on complementary metal-oxide-semiconductor (CMOS) integrated circuits.

A varactor is a controllable capacitor. Metal-oxide-semiconductor (MOS) varactors are widely used in high frequency integrated circuits. For example, MOS varactors are commonly used as voltage-controlled tuning components in voltage-controlled oscillators. Voltage-controlled oscillators are used in circuits such as phase-locked loops. Phase-locked loops, in turn, are often used in circuits such as clock and data recovery circuits.

Successful operation of these circuits depends on accurate and predictable varactor performance. High performance varactors are characterized by high quality factors, a wide voltage-controlled capacitance range, and good linearity.

Previous attempts to improve on conventional MOS varactor designs have used so-called junction varactors, which do not have a wide voltage-controlled capacitance range. Other proposals have required significant changes to existing semiconductor processing techniques. Changes such as these are generally not commercially feasible.

It is therefore an object of the present invention to provide improved MOS varactors.

SUMMARY

Metal-oxide-semiconductor (MOS) varactors and methods for forming MOS varactors are provided. The varactors are formed as part of an integrated circuit that contains metal-oxide-semiconductor transistors. The integrated circuit may contain n-channel metal-oxide-semiconductor (NMOS) and p-channel metal-oxide-semiconductor (PMOS) transistors.

During fabrication, doped layers are formed by ion implantation. A deep n-well implant is used to provide the integrated circuit with a deep n-well layer. A shallower n-type implant is used to form an n-well layer in the deep n-well layer.

A varactor has a deep n-well that is formed from a portion of the deep n-well layer. Another portion of the same deep n-well layer is used to form a deep n-well for the NMOS and PMOS transistors. Because the same ion implantation process is used to form the deep n-well for both the transistors and the varactor, it is not necessary to provide special ion implantation steps to improve varactor performance.

Other process steps are also shared. For example, the PMOS transistor and the varactor contain n-wells formed from portions of the same n-well layer. An oxide layer is formed using thermal growth techniques. A portion of the oxide layer serves as an insulator separating electrodes in the varactor. Other portions of the same thermal oxide layer serve as gate oxides for the NMOS and PMOS transistors. A shared n+ implant is used to form source-drain contact regions for the NMOS transistors and ohmic contact regions for the varactor. A polysilicon layer is used to form gate electrodes for the NMOS and PMOS transistors and one of the varactor electrodes.

The deep n-well has a doping profile that helps to reduce junction capacitance and improve varactor performance. Further performance enhancements are achieved by making layout adjustments to minimize parasitic capacitances.

The integrated circuit is fabricated using a semiconductor fabrication process having certain design rules. The design rules provide suggested and mandatory guidelines to be followed by circuit designers. For example, the design rules specify a minimum electrode-to-electrode distance that can be used for the varactor electrodes. The design rules also specify the maximum number of contact vias that can be used per unit length for one of the electrodes. Parasitic capacitances can be reduced by spacing the varactor electrodes farther than the minimum separation specified by the design rules. This reduces electromagnetic field coupling between the electrodes and reduces parasitic capacitance. Parasitic capacitances can also be reduced by decreasing the number of contact vias that are used for the varactor electrodes. By using fewer contact vias per unit length along the longitudinal axis of the electrode contact region than specified by the design rules, electromagnetic coupling between electrodes is reduced and parasitic capacitance is minimized.

Further features of the invention, its nature and various advantages will be more apparent from the accompanying drawings and the following detailed description of the preferred embodiments.

DETAILED DESCRIPTION

The present invention relates to voltage-controlled variable capacitors and methods for fabricating variable capacitors. Variable capacitors, which are often referred to as varactors, are commonly formed from metal-oxide-semiconductor (MOS) structures on integrated circuits. MOS varactors are used in a wide variety of applications and may be formed on programmable logic device integrated circuits, communications devices, circuits with analog and digital circuitry, application-specific-integrated circuits, and other integrated circuits.

The varactors of the present invention are preferably formed using the same process steps that are used to form complementary metal-oxide-semiconductor (CMOS) transistor devices. CMOS chips are widely used in the electronics industry. Although the steps that make up a CMOS fabrication process evolve over time as technology improves, a semiconductor fabrication facility ("fab") generally has only one or a few available qualified process flows that can be used to form CMOS integrated circuits. Because a fab must maintain strict controls on the manufacturing processes used during fabrication, it is generally not possible to fabricate a mass-produced CMOS integrated circuit unless the circuit can be formed using one of the qualified process flows.

With the present invention, improved MOS varactors can be formed using standard CMOS fabrication process flows. Modifications are made to the lithographic masks used during fabrication to accommodate the varactor designs of the present invention, but it is generally not necessary to modify the overall process steps used during semiconductor fabrication. This allows the varactor design of the present invention to be used in a wide variety of CMOS chips without requiring special fabrication steps.

Improvements in varactor performance are achieved with the invention by reducing internal resistance and parasitic capacitances.

Figure 1:
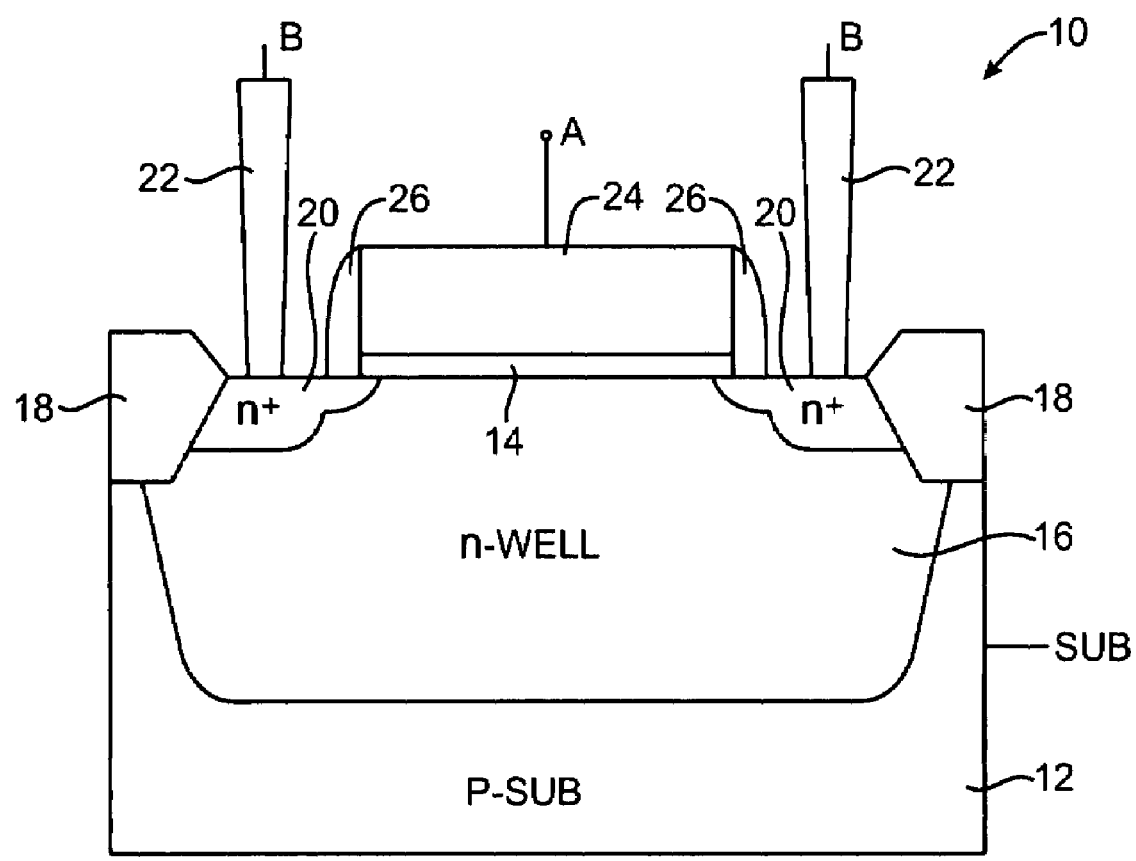
FIG. 1 is a cross-sectional view of an conventional metal-oxide-semiconductor (MOS) varactor.

A cross-sectional view of a conventional MOS varactor 10 is shown in FIG. 1. Varactor 10 is formed as part of an integrated circuit. The integrated circuit chip is formed from a silicon wafer. The silicon wafer has a p-type substrate 12. N-type wells 16 are formed in the p-type substrate. Silicon oxide ("oxide") isolation regions 18 isolate varactor 10 from surrounding components such as CMOS transistors formed on the integrated circuit.

The varactor 10 has three terminals. The substrate terminal SUB is connected to p-substrate 12 and is generally grounded at a ground voltage Vss of 0 volts. The capacitance $C_{dev}$ of the varactor is produced between the terminals labeled A and B. The magnitude of capacitance $C_{dev}$ depends on the voltage between A and B. By varying the voltage applied between A and B, the value of $C_{dev}$ can be adjusted.

The electrode for terminal B is formed from metal contact structures 22, which are connected to n-well 16 through n+ doped regions 20. Regions 20 are similar to the source-drain regions of conventional MOS transistors, but are of the same doping type as n-well 16. In a MOS transistor, regions 20 and well 16 would have opposite doping types. Contacts 22 are generally formed using metal vias.

The electrode for terminal A, which is similar to the gate of a MOS transistor, is typically formed from silicided polysilicon 24.

Spacers 26 serve to insulate electrode 24 from surrounding structures such as the contact vias for electrode 22. The lateral separation between each contact 22 and its adjacent spacer 26 is set to the minimum permitted by the CMOS semiconductor processing being used. In a completed device, additional insulating oxide layers are formed on top of the structures of FIG. 1.

Oxide layer 14 is a thin thermally-grown silicon oxide layer. Layer 14 is part of the same layer used to form the gate oxide of the MOS transistors on the integrated circuit.

The varactor 10 has two parallel plates. Polysilicon 24 forms an upper plate and n-well 16 forms a lower plate. There is a depletion region in the n-type silicon of region 16. The capacitance of varactor 10 is equal to the sum of the oxide capacitance $C_{ox}$ and the depletion layer capacitance $C_i$. The width of the depletion layer and therefore the value of $C_i$ is a function of the voltage drop across the depletion layer. By adjusting the voltage between terminals A and B, the value of $C_i$ and therefore the total capacitance $C_{dev}$ of the varactor 10 can be adjusted.

In practice, the design of FIG. 1 has a number of non-ideal characteristics. For example, the maximum capacitance $C_{dev}$ is affected by parasitic capacitances. These parasitic capacitances arise from the close proximity between electrode 24 and electrode 22 and from the abrupt nature of the doping profile in well 16. Moreover, the quality factor Q is adversely affected by the relatively high sheet resistance of n-well 16. Because the current path connecting terminals B to the well region underlying gate oxide 14 traverses a significant lateral distance through n-well 16, the sheet resistance of n-well 16 contributes a non-negligible resistance to the varactor. This resistance lowers the varactor's Q value.

When a conventional varactor such as varactor 10 of FIG. 1 is implemented in a circuit, the relatively high sheet resistance of n-well 16 adversely affects performance. Circuit phase noise is inversely proportional to the quality factor Q of the varactor, so when Q is reduced due to the presence of the non-negligible sheet resistance of n-well 16, noise increases and performance suffers.

Figure 2:
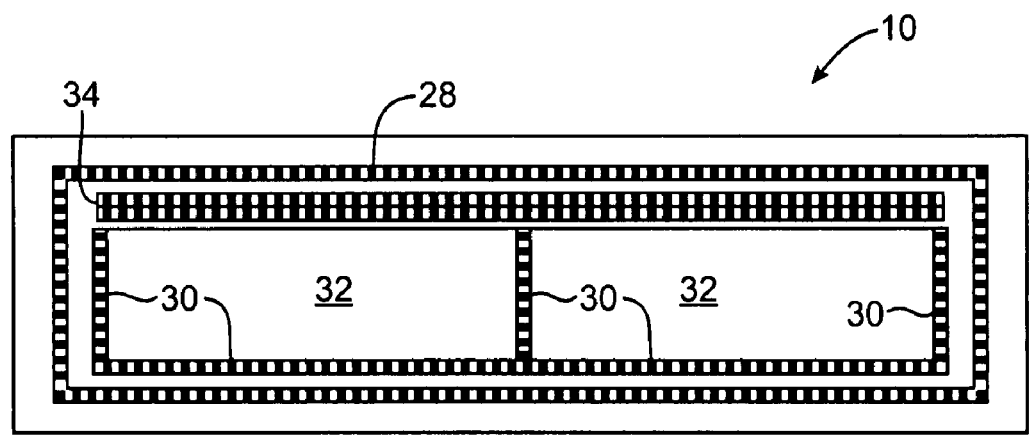
FIG. 2 is a plan view of a conventional MOS varactor layout.

The layout of a conventional varactor is shown in FIG. 2. Electrical contacts are made using contact vias formed through the isolation oxide (shown as oxide 18 in FIG. 1). The contacts appear as dark squares in the plan view of FIG. 2. Electrical contacts to the substrate region (the SUB terminal in FIG. 1) are made using contact vias in substrate contact ring 28. Electrical contacts to the upper varactor electrode (terminal A and polysilicon region 24 of FIG. 1) are made in contact region 34. Electrical contacts to the lower varactor electrode (terminal B and contact metal 22 in FIG. 1) are made in contact region 30.

With the conventional layout of FIG. 2, there is a relatively large plate region 32. The area of plate region 32 determines the area under the polysilicon region 24 of FIG. 1. Because the area of plate region 32 is large, the lateral distance from the contacts of terminal B to the middle of region 32 is relatively large. The sheet resistance of the conventional n-well region 16 of varactor 10 is relatively high, so the resistance of a varactor 10 having a layout of the type shown in FIG. 2 is relatively high and the quality factor Q is low.

Figure 3:
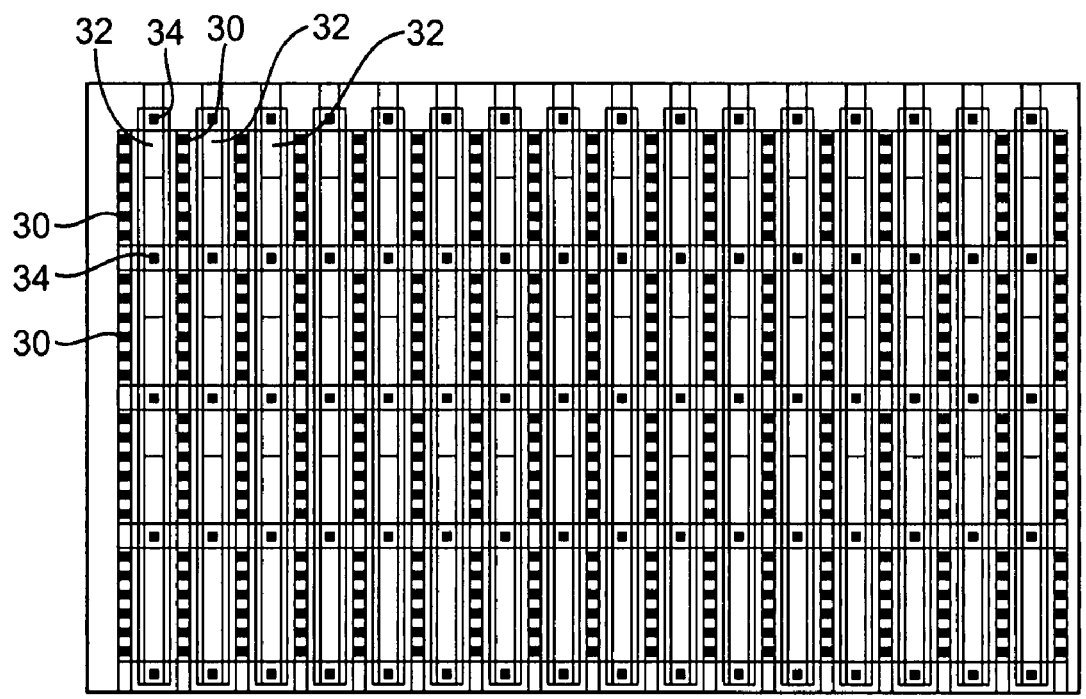
FIG. 3 is a plan view of another conventional MOS varactor layout.

In an effort to address the low quality factor Q that results from using a varactor layout of the type shown in FIG. 2, some conventional varactors use a layout of the type shown in FIG. 3. In the FIG. 3 arrangement, multiple smaller plates 32 are used in parallel. Each plate region 32 has an area that is relatively small compared to its contact regions 30 and 34 (substrate contact region 28 is not shown in the example of FIG. 3). Because the area of each plate 32 is small, the lateral dimensions of the n-well underlying each plate are reduced. This reduces the path length between the B terminal contacts and the channel region in n-well 16 beneath terminal A, thereby increasing the Q factor of the varactor.

Although the layout of FIG. 3 can improve a varactor's Q factor, this type of layout cannot always be used, because fringing fields tend to reduce the maximum capacitance tuning range (i.e., the maximum achievable ratio of $C_{max}/C_{min}$).

Figure 4:
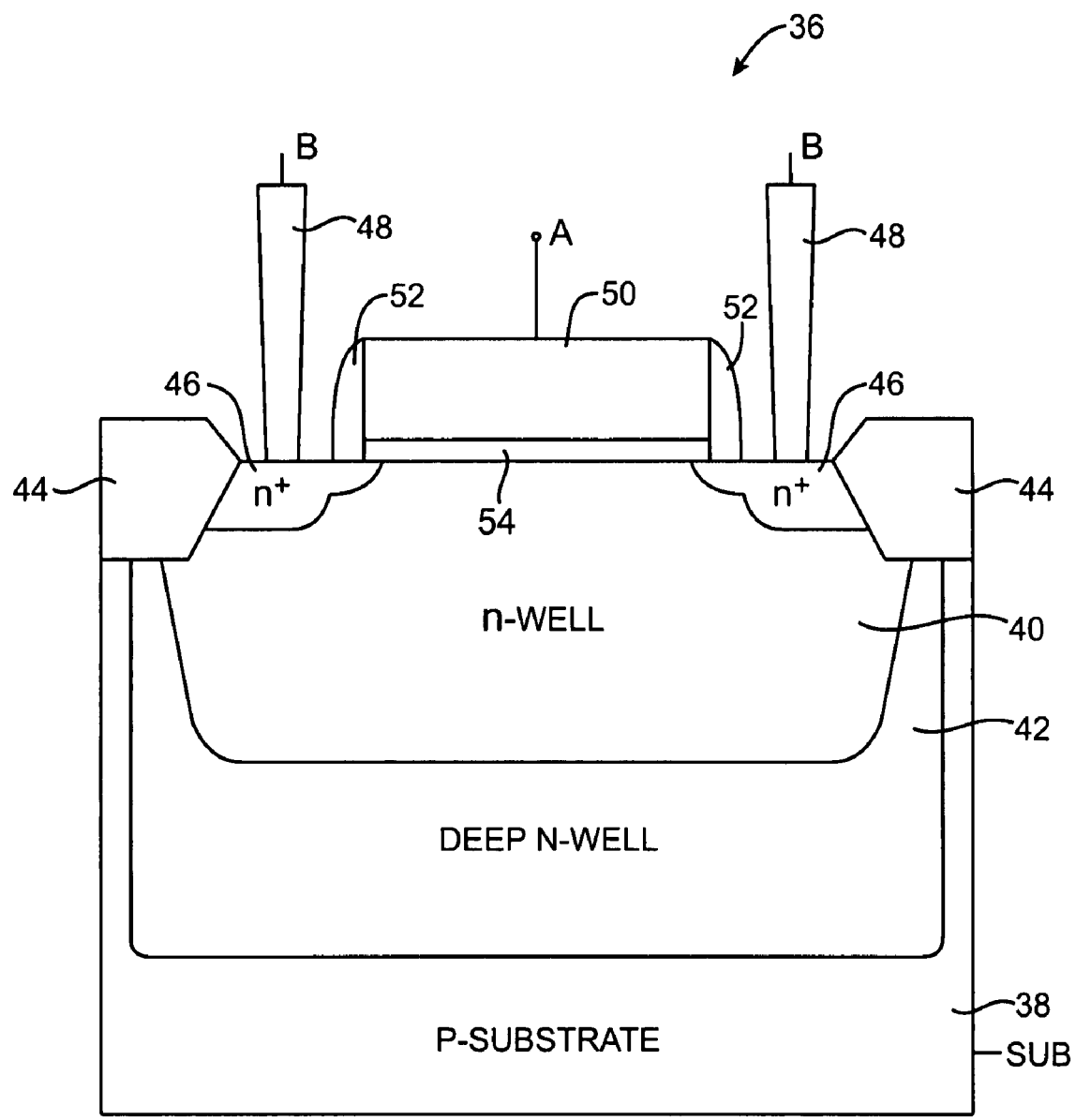
FIG. 4 is a cross-sectional view of an illustrative MOS varactor in accordance with the present invention.

A cross-sectional view of a varactor 36 in accordance with the present invention is shown in FIG. 4. Varactor 36 is formed as part of an integrated circuit using a silicon wafer having a p-type substrate 38. Varactor 36 is preferably formed at the same time as complementary metal-oxide-semiconductor (CMOS) transistors elsewhere on the same integrated circuit. Custom lithographic masks are used to define the contacts, implant regions, and other structures associated with varactor 36, but no semiconductor fabrication process steps are needed other than those already required in the process flow used to form the CMOS transistors.

The top plate of varactor 36 is formed from a conductor such as silicided polysilicon 50. Polysilicon 50 forms a first varactor electrode (terminal A). The lower plate of varactor 36 is formed from n-well 40 and deep n-well 42. Deep n-well 42 and n-well 40 are electrically connected to a second varactor electrode (terminal B).

Deep n-well 42 is formed from the same deep n-type implant that is used to form deep n-well structures for CMOS transistors elsewhere on the integrated circuit, so no special process steps are required. Deep n-well 42 is referred to as being a "deep" n-well because it is deeper than the n-wells used for the PMOS transistor channels on the circuit.

Deep n-well 42 is not heavily doped (n+), which helps to reduce undesirable parasitic capacitance effects. Moreover, deep n-well 42 conducts current in parallel with n-well 40. This serves to reduce the sheet resistance of varactor 36. By reducing the sheet resistance of the varactor plate region, the quality factor Q is improved, without adversely affecting the capacitance tuning range of the varactor 36.

A layout of the type shown in FIG. 2, a layout of the type shown in FIG. 3, or any other suitable layout can be used for varactor 36. All of these layouts will benefit from the sheet resistance reduction produced by n-well 42.

N-well 40 and polysilicon region 50 are separated by a thermally-grown oxide layer 54. Oxide layer 54 is part of the gate oxide layer used in CMOS transistors formed elsewhere on the integrated circuit on which varactor 36 is located.

Oxide isolation regions 44 serve to electrically isolate varactor 36 from surrounding electrical structures. Heavily-doped n+ contact regions 46 are used to facilitate formation of an ohmic contact between B-terminal contacts 48 and n-well 40. Contacts 48 are typically formed from metal vias. If desired, contacts 48 may contain multiple metal layers. These layers may, for example, serve as diffusion barriers, electromigration barriers, adhesion layers, layers for lowering contact resistance, etc. In general, the contacts 48 for the terminal B electrode and the conductive structure 50 for the terminal A electrode may be formed from any suitable conductive materials. The substrate 38 is typically grounded at a ground voltage Vss of 0 volts using the connection shown schematically as terminal SUB in FIG. 4. Spacers 52 may be formed from insulating layers such as layers of silicon oxide, silicon nitride, oxynitride, etc. Additional insulating layers (e.g., oxide) are used to further encapsulate and isolate the structures of FIG. 4. For example, oxide is generally deposited between contacts 48 and spacers 52 to ensure isolation of the varactor electrodes.

Figure 5:
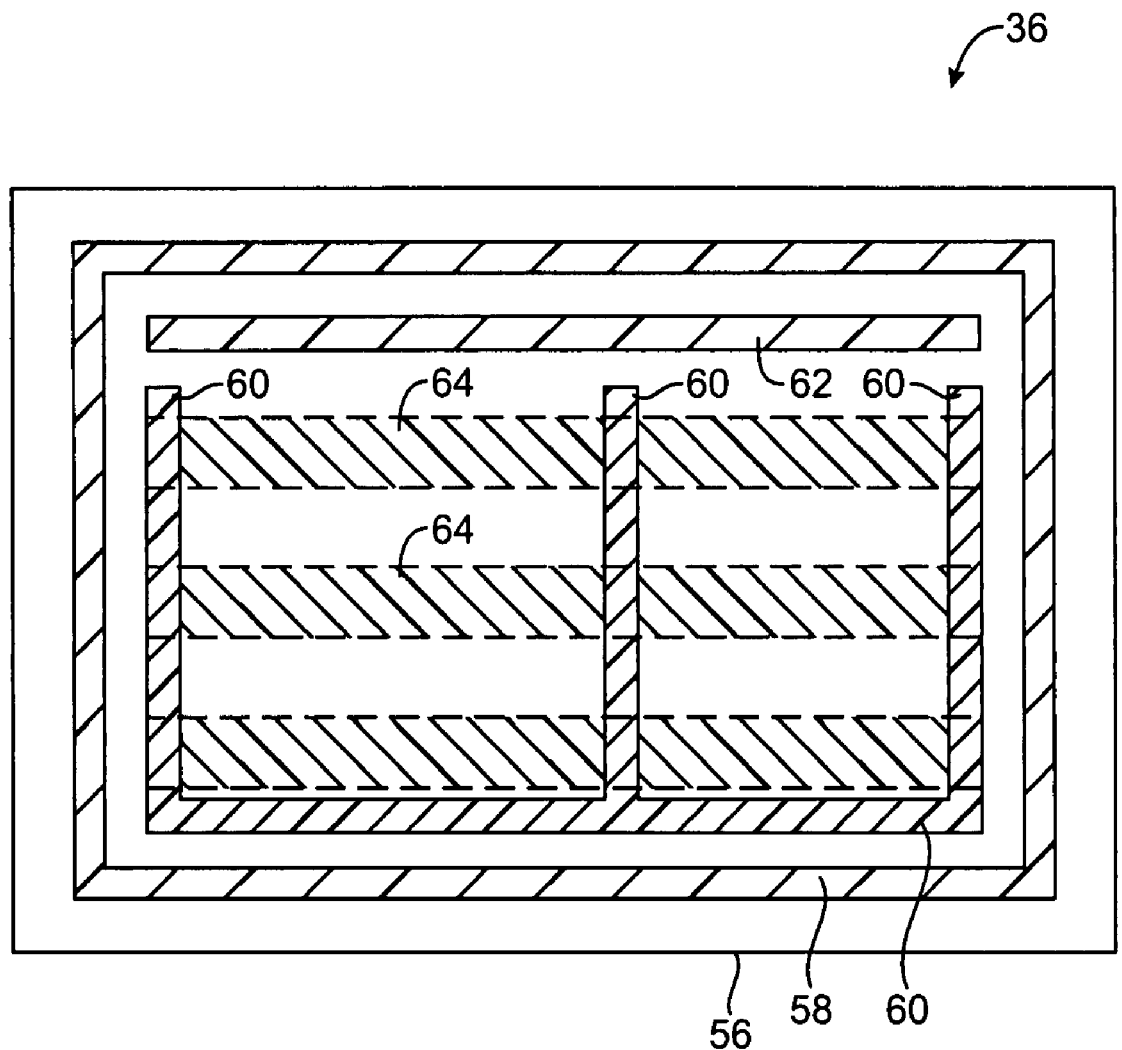
FIG. 5 is a plan view of an illustrative MOS varactor in accordance with the present invention.

Any suitable layout may be used for the varactor 36, including layouts of the type shown in FIGS. 2 and 3. Another illustrative layout is shown in plan view of FIG. 5. In the arrangement of FIG. 5, varactor 36 is formed on a portion 56 of an integrated circuit. The area of ring 58 is used for forming substrate contacts. Contact region 60 is used for forming the B-terminal electrode using contact vias 48 of FIG. 4. Region 62 is used for forming contacts for the A electrode 50 in FIG. 4. The A electrode is typically formed from an unbroken plate of polysilicon. The B electrode is generally formed from a series of electrically connected metal vias that are formed on top of n+ region 46.

If desired, the deep n-well 42 (FIG. 4) need not be formed as a uniform layer underlying the varactor. The deep n-well 42 may be formed in a pattern, so that only certain parts of the varactor have an underlying deep n-well. As an example, the deep n-well 42 may be formed in a striped pattern, as shown by deep n-well stripes 64 in FIG. 5.

Setting aside parasitic effects, the capacitance of the varactor 36, $C_{dev}$, is equal to two capacitances $C_{ox}$ and $C_i$, taken in series. The capacitance $C_{ox}$ represents the capacitance contribution due to the oxide layer 54 of FIG. 4. Although this capacitance is a function of the thickness of oxide layer 54, once oxide layer 54 has been fabricated, $C_{ox}$ is fixed and does not change under different applied voltage levels. The capacitance $C_i$ represents the capacitance contribution due to the depletion layer in n-well 40. The capacitance $C_i$ is inversely proportional to the depletion layer width. At large depletion layer widths, the capacitance $C_i$ is low. At small depletion layer widths, the capacitance $C_i$ is high.

Figure 6:
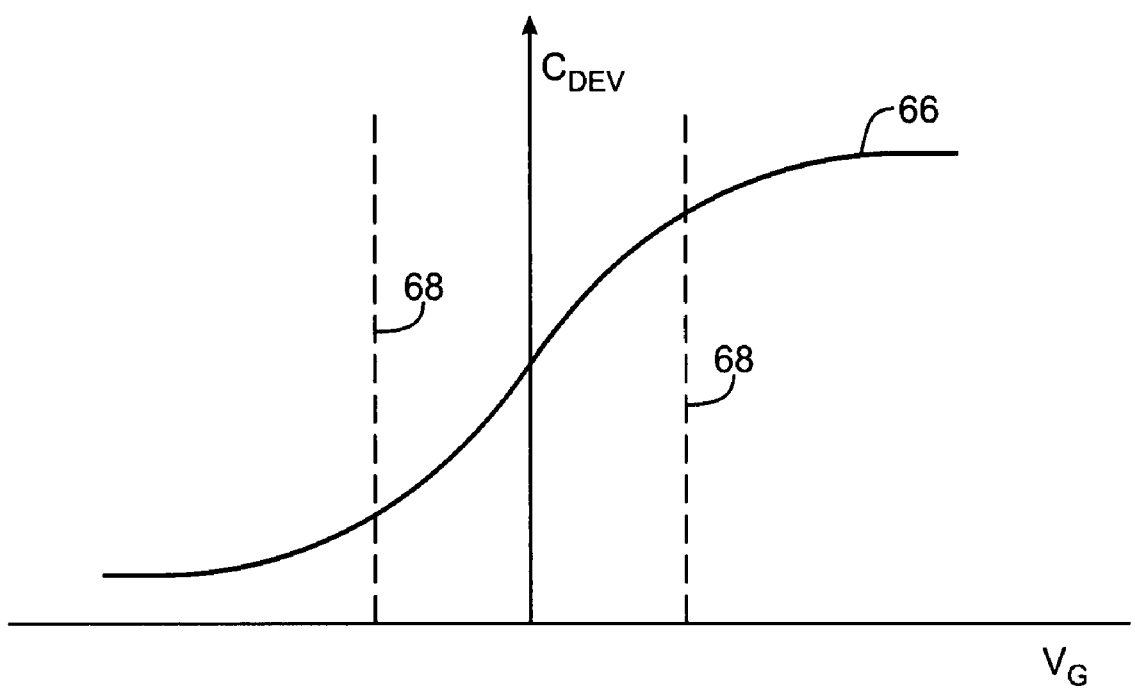
FIG. 6 is a graph showing how varactor capacitance changes as a function of applied voltage in accordance with the present invention.

The width of the depletion layer is a function of the voltage $V_g$ across terminals A and B. The impact of adjusting the voltage $V_g$ on the capacitance $C_{dev}$ is shown in the graph of FIG. 6. Curve 66 in FIG. 6 represents the total capacitance $C_{dev}$ of the varactor 36. The parameter $V_g$ represents the voltage across terminals A and B. At large positive values of $V_g$, electrons are drawn towards oxide layer 54. In this case, the width of the depletion layer is small and the capacitance $C_i$ is high. As a result, the value of $C_{dev}$ on the right side of FIG. 6 is high. At large negative values of $V_g$, the silicon in the varactor is depleted. In this case, the depletion layer width is high and the capacitance $C_i$ is low. The low value of the $C_i$ capacitance contribution lowers $C_{dev}$, as shown on the left side of the graph in FIG. 6. During normal operation, varactor 36 is operated in the linear regime between the dotted lines 68 in FIG. 6. In this regime, the value of $V_g$ can be adjusted to make predictable and significant changes in the capacitance $C_{dev}$.

The ability to adjust varactor 36 properly in regime 68 is adversely affected by parasitic capacitances. Parasitic capacitances are unwanted capacitances that arise from the nature of the varactor structure. If parasitic effects are too large, the capacitance $C_{dev}$ will be disproportionately affected by parasitic capacitances, which will make control of the varactor difficult (i.e., the value of $C_{max}/C_{min}$ will be lowered because the minimum value of $C_{min}$ that can be achieved will be higher than desired).

One source of parasitic capacitance in varactor 36 arises from the junction capacitance of the varactor. A p-n junction is formed between n-well 42 and p-substrate 38. This p-n junction has an associated capacitance. The doping profile of deep n-well 42 in varactor 36 is more gradual than the doping profile of a conventional n-well 16 (FIG. 1). The depletion width at the junction in the varactor 36 is therefore larger than in conventional varactors, which reduces parasitic junction capacitance and improves performance.

Figure 7:
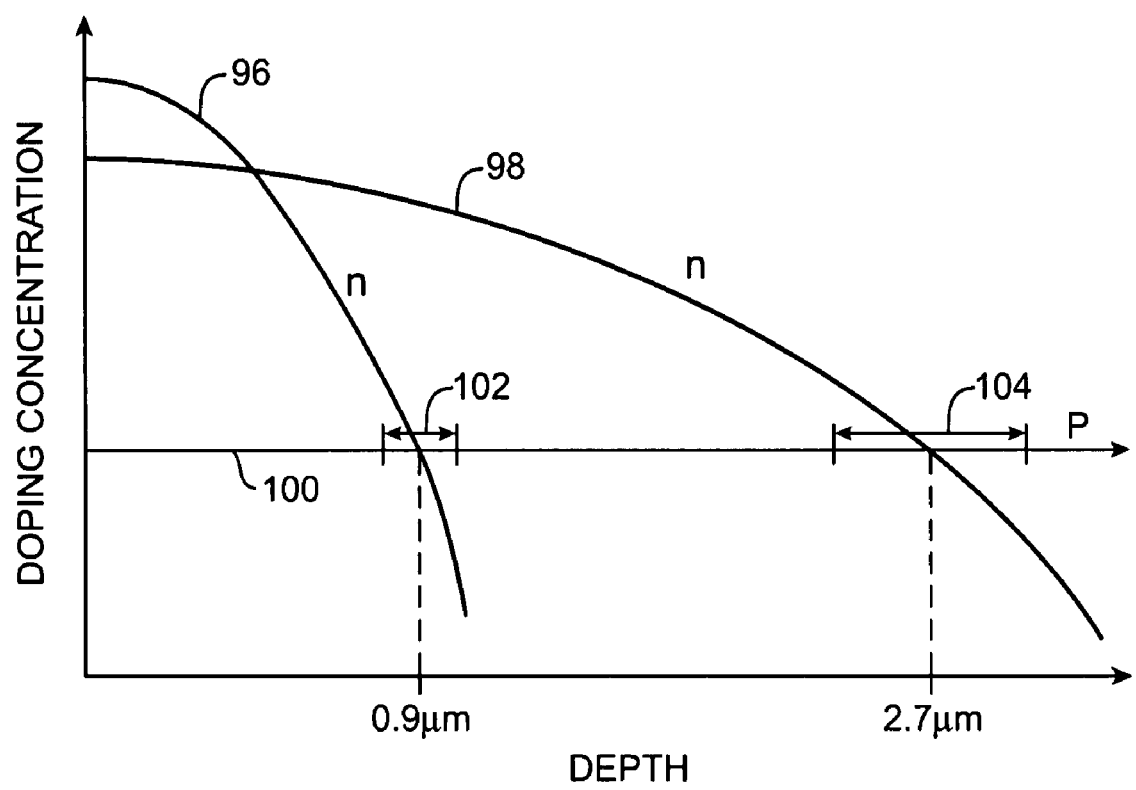
FIG. 7 is a doping profile graph showing doping profiles for a conventional MOS varactor and a MOS varactor with a deep n-well implant in accordance with the present invention.

The doping profile of a deep n-well in a varactor in accordance with the present invention and the doping profile of an n-well in a conventional varactor are shown in FIG. 7. The y-axis in graph of FIG. 7 represents doping concentration. The x-axis in the graph represents depth below the silicon surface (i.e., depth into the substrate from an origin taken at the varactor's thin thermal oxide layer). An illustrative p-type doping for substrate 38 is given by the level of line 100. This p-type doping exists throughout the wafer, including the n-well regions. The n-well regions are n-type rather than p-type, because the n-type doping concentration in the n-wells exceeds the underlying p-type doping level represented by line 100.

N-wells such as n-wells 40 and 42 of FIG. 4 are typically formed by ion-implantation. Ion-implantation is a semiconductor manufacturing process in which dopant ions are implanted into the silicon substrate.

In the graph of FIG. 7, curve 96 represents a typical doping profile that might result when implanting n-type dopant into a silicon substrate to form conventional n-well 16 of FIG. 1. As shown in the graph, the n-type doping concentration given by curve 96 is greater than the p-type concentration level given by curve 100 for depths less than about 0.9 µm. The depth of the n-well 16 in this example would therefore be 0.9 µm. During operation of a conventional varactor with this doping profile, there is a depletion region at the p-n junction between n-well 16 and substrate 12 having a depletion width 102.

The n-type doping concentration for a typical deep n-well such as n-well 42 of FIG. 4 is given by curve 98. The n-type doping concentration represented by curve 98 is greater than the p-type concentration of the substrate 38 for depths less than 2.7 µm. The depth of the deep n-well 42 corresponding to the doping profile of curve 98 is therefore 2.7 µm. The depletion region associated with the p-n junction between n-well 42 and p-substrate 38 has a width 104.

The widths 102 and 104 of the depletion regions are not the same, because the doping profiles 96 and 98 have different slopes. In particular, the gradient of curve 96 at 0.9 µm is steeper than the gradient of curve 98 at 2.7 µm. The gradient of curve 98 is shallower than the gradient of curve 96, because the CMOS ion-implantation process used to form deep n-well 42 produces shallower dopant profiles than the ion-implantation process used to form conventional n-wells such as n-well 16 of FIG. 1.

Because conventional varactor junctions have more abrupt doping profiles than the varactor junctions of the present invention, the depletion widths of conventional varactor junctions are smaller than the depletion widths of varactor junctions in varactors constructed in accordance with the present invention. This is shown in the example of FIG. 7, in which conventional depletion width 102 is smaller than the depletion width 104. The relatively large width 104 reduces the parasitic capacitance associated with the p-n junction in varactor 36 and improves performance.

The parasitic capacitance associated with the p-n junction, $C_{p\text{-}tot}$ can be modeled using two components: a diode capacitance component $C_{dio}$ and parasitic component $C_p$. These components are shown in the varactor equivalent circuit of FIG. 8.

Figure 8:
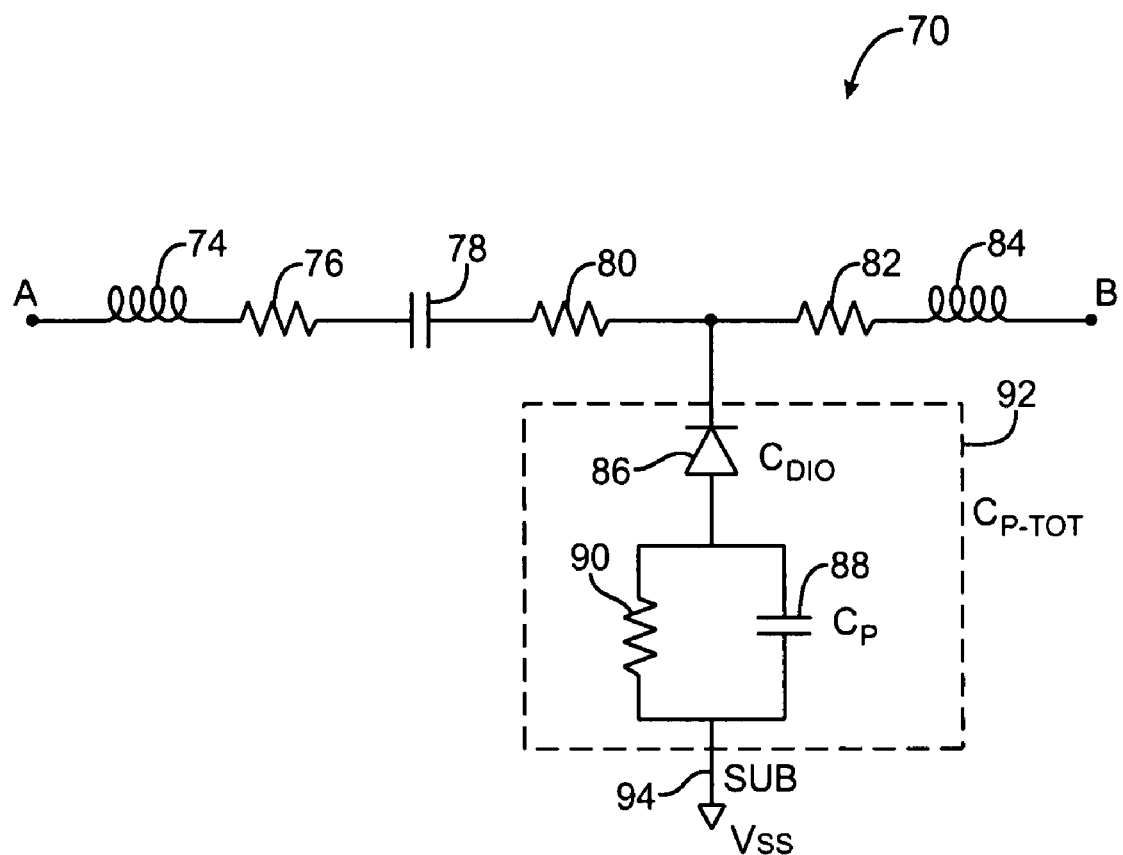
FIG. 8 is an equivalent circuit used in modeling the performance of the varactor in accordance with the present invention.

The diagram of FIG. 8 includes an equivalent circuit 70 for the varactor 36. In equivalent circuit 70, parasitic inductances associated with the electrode structures of terminals A and B are given by inductors 74 and 84, respectively. Resistors 76, 80, and 82 are used to model parasitic resistances for the structures of terminals A and B. The ideal capacitor 78 is used to represent the capacitance of the varactor 36.

As shown by the components in dotted line box 92 of FIG. 8, there is a parasitic capacitance $C_{p\text{-}tot}$ associated with the p-n junction in varactor 36. The component $C_{dio}$ is associated with diode 86. Parasitic capacitance component $C_p$ is modeled by capacitor 88, which is connected in parallel with parasitic resistor 90. In the equivalent circuit of FIG. 8, capacitor 88 and resistor 90 are connected between diode 86 and substrate terminal 94.

Performance simulations have been made using the equivalent circuit 70 of FIG. 8. A standard MOS transistor computer model was adapted in making these simulations. In the MOS transistor model, the MOS transistor gate serves as the capacitor 78. When configuring the model to represent the varactor equivalent circuit 70, the transistor's source and drain contacts were connected to high resistance values, which effectively removed the source and drain from the simulation.

Figure 9:
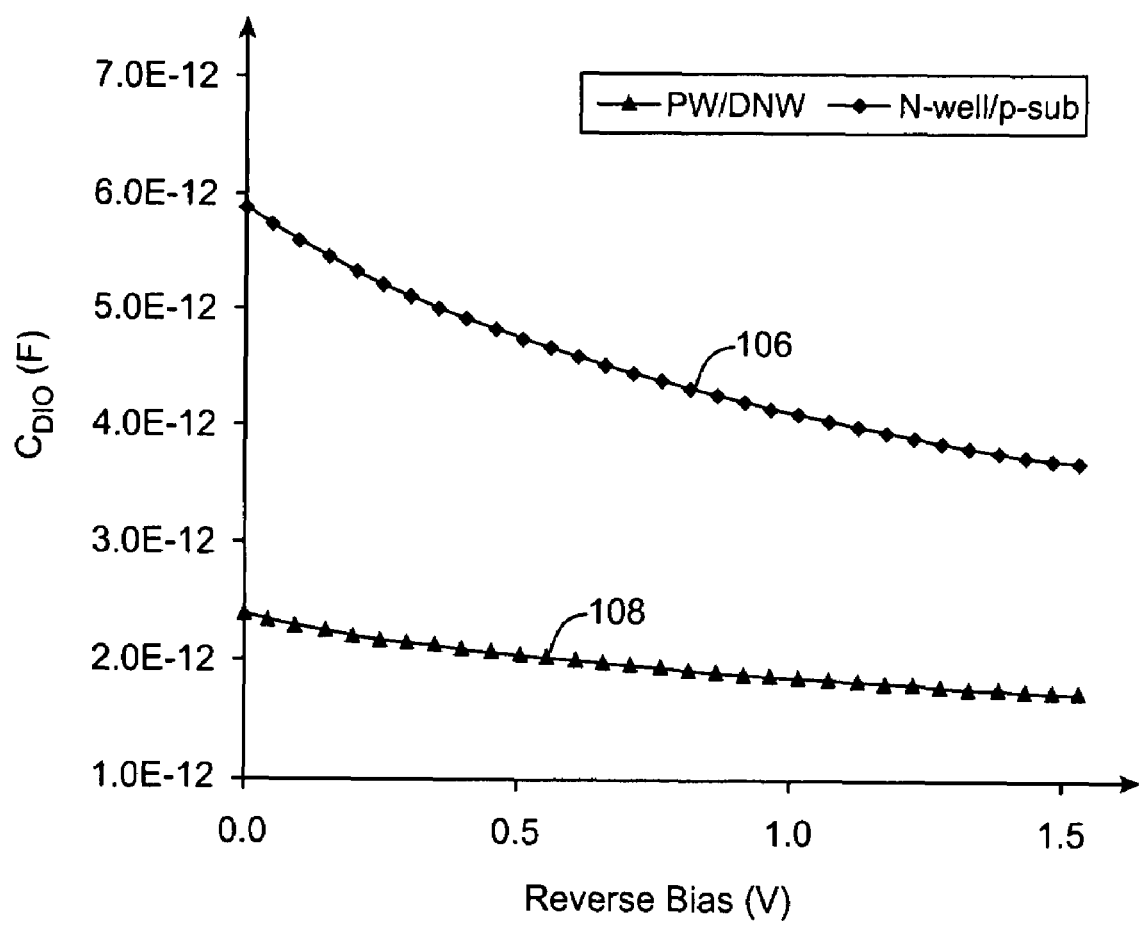
FIG. 9 is a graph showing how the junction capacitance of the varactor is reduced by using a deep n-well implant with a gradual dopant gradient in accordance with the present invention.

FIG. 9 shows computed values of $C_{dio}$ under various bias conditions ($V_g$ values). The capacitance $C_{dio}$ is shown for two illustrative structures. Line 106 corresponds to a varactor without a deep n-well such as the conventional varactor 10 of FIG. 1. Line 108 corresponds to a varactor with a deep n-well 42 such as varactor 36 of FIG. 4. As the comparison of FIG. 9 makes clear, the presence of a deep n-well with its shallow doping profile substantially reduces the parasitic junction capacitance of the varactor. In the example of FIG. 9, the magnitude of the parasitic junction capacitance component $C_{dio}$ is reduced by more than 50% relative to the parasitic junction capacitance component $C_{dio}$ for a conventional varactor. By reducing the magnitude of the parasitic junction capacitance in this way, the performance of the varactor is enhanced.

Simulations have also been used to quantify the performance enhancement achieved by using the deep n-well 42 to reduce the varactor's series resistance. Series resistance simulation results are shown in FIGS. 10 and 11.

Figure 10:
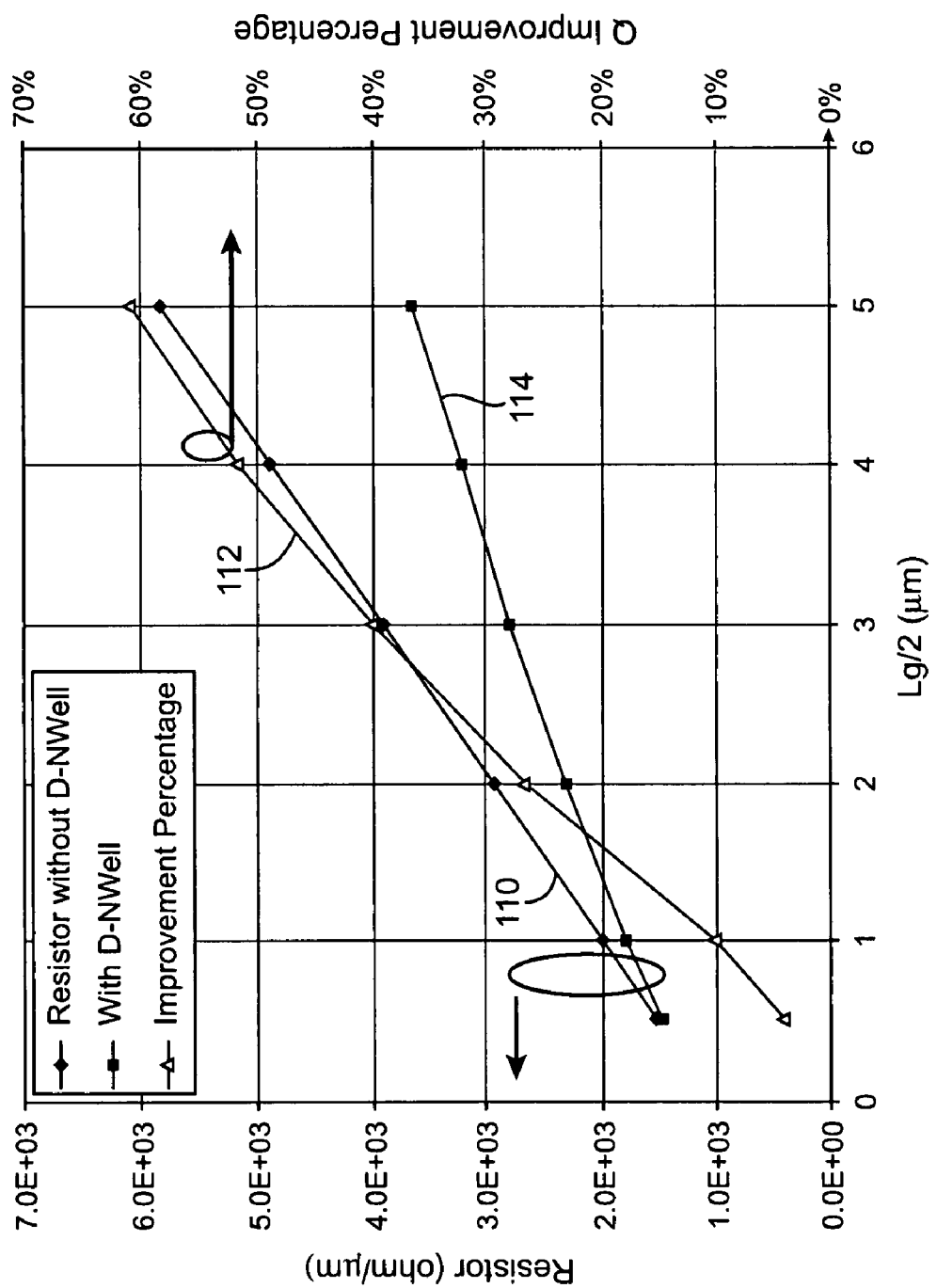
FIG. 10 is a graph of calculations showing the improved reduction in series resistance expected when using the deep n-well implant of the present invention.

In FIG. 10, the resistances of two varactors are shown. Curve 110 corresponds to a conventional varactor without a deep n-well. Curve 114 corresponds to a varactor with a deep n-well such as varactor 36 of FIG. 4. The y-axis for curves 110 and 114 represents the series resistance of the varactor. The plotted resistance value has been normalized per unit length in the dimension perpendicular to the cross-sectional lateral width $L_g$ of the varactor. Varactors of different sizes are taken into account by plotting the resistance values for different values of $L_g/2$ (the x-axis in FIG. 10). Large values of $L_g/2$ represent varactors with large lateral dimensions (large plate regions). Small values of $L_g/2$ represent varactors with smaller lateral dimensions.

Curve 112 of FIG. 10 is a plot of the quality factor improvement percentage (curve 110 divided by curve 114) as a function of $L_g/2$. Large values of $L_g/2$ correspond to varactors with relatively larger lateral dimensions (large plate regions), which are sensitive to the sheet resistance of their n-type silicon regions. The greatest reduction in resistance is therefore achieved at large values of $L_g/2$.

Figure 11:
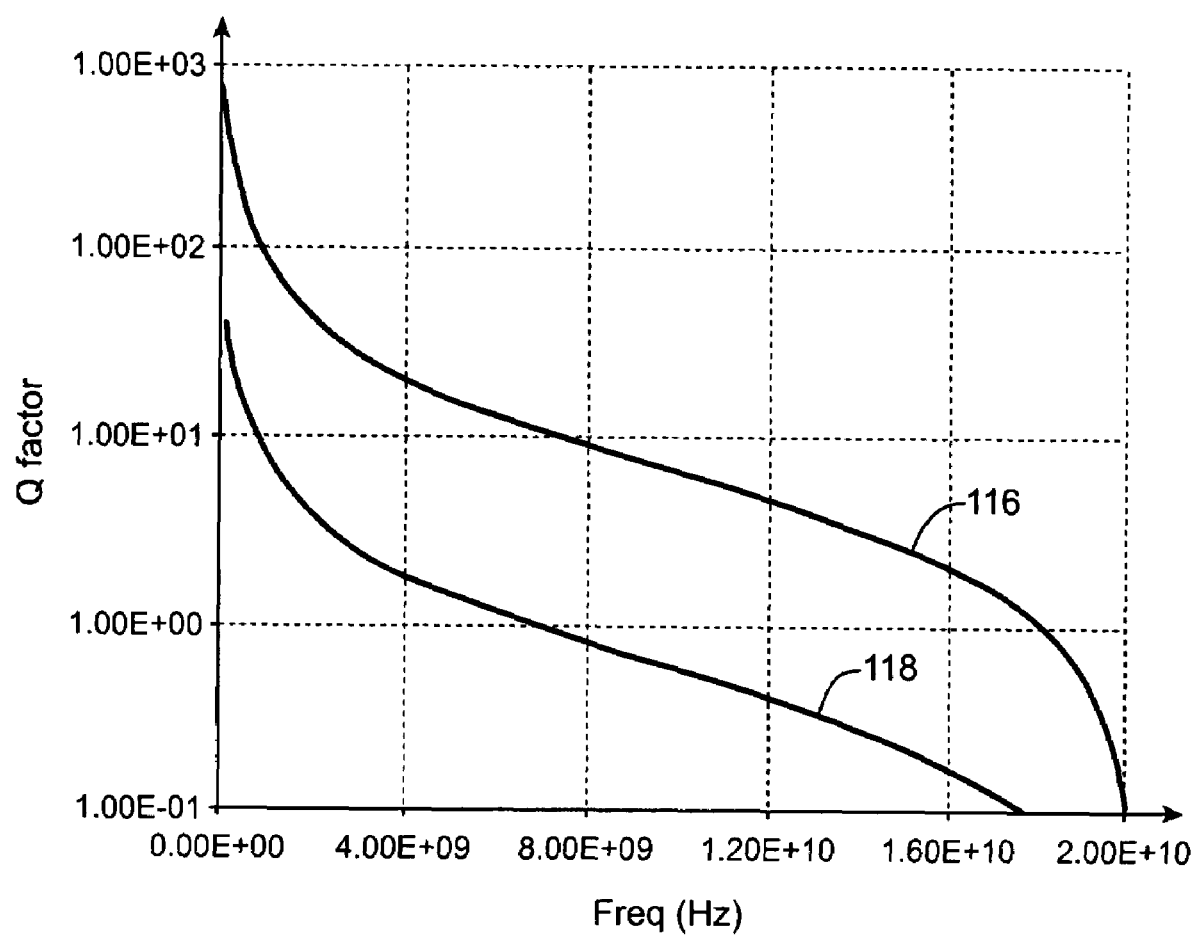
FIG. 11 is a graph showing calculated improvements in quality factor expected when using the deep n-well implant of the present invention.

In FIG. 11, the quality factor Q for the two varactors of FIG. 10 has been plotted as a function of operating frequency. Curve 118 shows the calculated Q factor for a conventional varactor of the type associated with line 110 of FIG. 10. Curve 116 shows the calculated Q factor for a comparably-sized varactor 36 having a deep n-well. As shown in FIG. 11, the lowered series resistance of the varactor 36 that results from the deep n-well improves the varactor's Q factor significantly over the entire range of frequencies considered.

In addition to being affected by parasitic capacitance effects from junction capacitance, varactors are affected by parasitic capacitances arising from electromagnetic field coupling between the A terminal electrode 50 and surrounding structures. These parasitic capacitances are sometimes said to result from "fringing" fields. The influence of fringing field parasitic capacitances on the capacitance $C_{dev}$ of the varactor can be quantified using equations 1 and 2.

$$C_{dev}^{-1} = C_{ox}^{-1} + (C_i + C_{ftot}) \quad (1)$$

$$C_{ftot} = C_{f1} + C_{f2} \quad (2)$$

In equations 1 and 2, $C_{dev}$ is the total capacitance of the varactor. $C_{ox}$ is the capacitance across the oxide layer 54 (FIG. 4). $C_i$ is the capacitance inside the varactor's channel (n-type semiconductor region). $C_{ftot}$ is the total parasitic capacitance due to fringing fields. $C_{f1}$ is the parasitic capacitance due to coupling between the electrode 50 of terminal A and the contact vias 48 in the electrode of terminal B. $C_{f2}$ is the parasitic capacitance due to coupling between the electrode 50 and the n+ regions 46 that lie under the B terminal contacts 48.

Both $C_{f1}$ and $C_{f2}$ are parasitic capacitances that tend to reduce the minimum achievable value of $C_{dev}$. This tends to reduce performance for the varactor. In accordance with the present invention, the adverse impact of parasitic capacitances $C_{f1}$ and $C_{f2}$ can be mitigated by reducing their magnitudes.

The factors that influence the magnitude of $C_{f1}$ and $C_{f2}$ are set forth in equations 3 and 4.

$$C_{f1} = \epsilon_{ox} W x_p d^{-1} \quad (3)$$

$$C_{f2} = \epsilon_{ox} k^{-1} \ln(1 + x_p t_{ox}^{-1}) \quad (4)$$

The variable d represents the lateral distance between the terminal B electrode (vias 48) and the terminal A electrode (polysilicon 50). As shown in equation 3, the magnitude of $C_{f1}$ is influenced by the value of d. In particular, $C_{f1}$ is inversely proportional to the electrode-to-electrode spacing d. By increasing d, $C_{f1}$ can be reduced.

In equation 4, k is the Boltzmann constant and $t_{ox}$ is the thickness of oxide layer 54 (FIG. 4). The value of $t_{ox}$ is generally established by the CMOS fabrication process being used to fabricate the integrated circuit and cannot be adjusted to improve varactor performance without adversely affecting other devices.

Both $C_{f1}$ and $C_{f2}$ are affected by the height $x_p$ of the polysilicon in electrode 50. If electrode 50 is larger, there is more conductive structure involved in the coupling process. Generally, however, it is difficult to change $x_p$ without disturbing the established process flows used during the manufacturing process. The constant $\epsilon_{ox}$, which represents the permittivity of the oxide or other dielectric separating the contacts, is a function of the materials chosen for the dielectric and also cannot be adjusted without disturbing the manufacturing process.

The variable W in equation 3 represents the effective width of the terminal B electrode formed using contact vias 48. The effective width is measured along the longitudinal dimension of contact regions such as contact region 60 of FIG. 5. Larger W values increase coupling and therefore increase $C_{f1}$. By reducing the number of contact vias used per unit length in the terminal B electrode, the effective value of W can be reduced, thereby reducing $C_{f1}$. This effect is illustrated in FIGS. 12 and 13.

Modern CMOS semiconductor fabrication processes are complex. In order to reduce or eliminate unintended fabrication problems, a number of mandatory and permissive "design rules" are established by the semiconductor integrated circuit fabrication facility. For example, a design rule may be established that sets a minimum line width for the lithographic masks used during fabrication. Because the process of developing a lithographic mask set and using the mask set to fabricating integrated circuits is expensive and time consuming, integrated circuit designers generally adhere to both the permissive and mandatory design rules.

In accordance with the present invention, two permissive design rules are not followed. The first design rule relates to the number of contacts 48 (FIG. 4) used per unit of length along the longitudinal axis of contact regions such as contact regions 60 of FIG. 5. The second design rule relates to the spacing d that is used to separate electrode 50 from the electrode formed from contacts 48.

Figure 12:
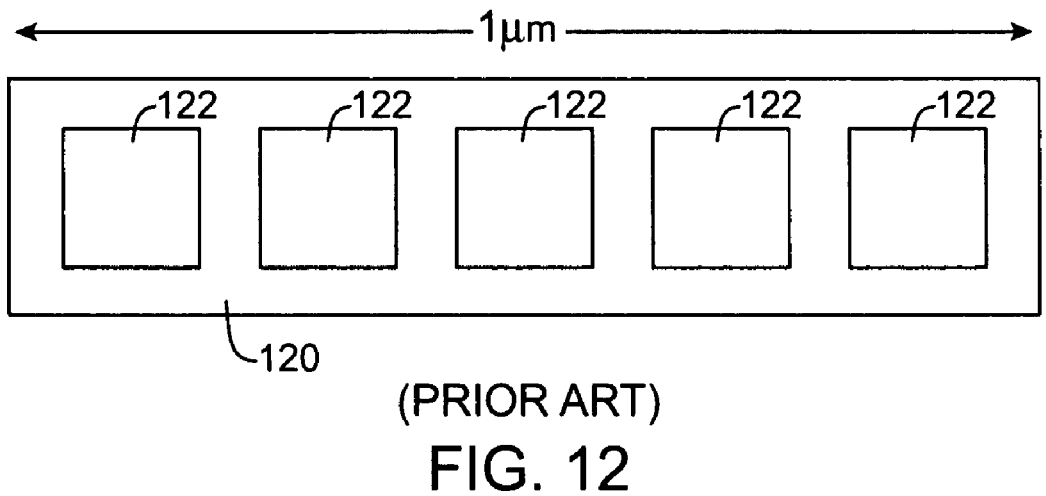
FIG. 12 is a plan view of an conventional varactor contact structure.
Figure 13:
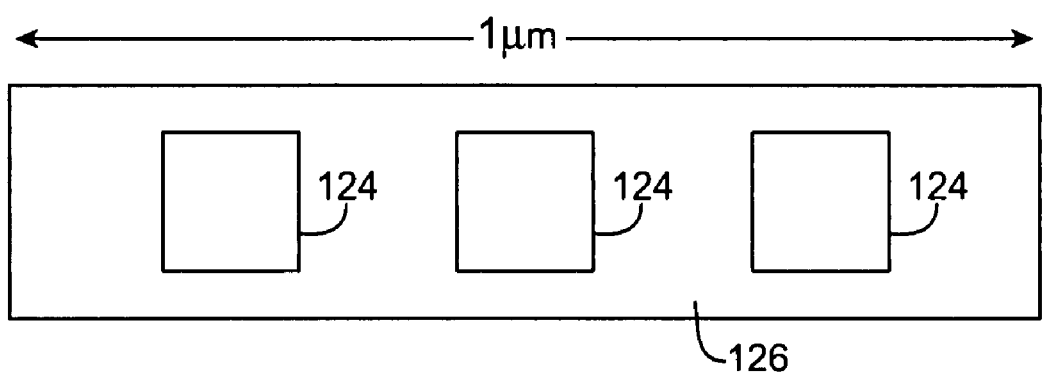
FIG. 13 is a plan view of a varactor contact structure in accordance with the present invention.

A one-micron strip of a conventional contact region 120 is shown in FIG. 12. Region 120 corresponds to a region such as region 30 in FIGS. 2 and 3. In the example of FIG. 12, there are five contact vias 122 per unit length (i.e., five contact vias for each micron of contact region 120). To reduce contact resistance, conventional varactors generally use the maximum number of contact vias per unit length that is permitted by the CMOS fabrication, design rules (i.e., five per micron in this example). The contact vias are formed in via holes formed through an insulating oxide layer on the surface of the silicon wafer. Each contact hole allows a via of conductor 22 to penetrate to n+ region 20, as shown in FIG. 1.

Conventional varactors have a large number of contact vias. Although a large number of contacts may help to reduce contact resistance, the effective value of W is high when there are a relatively large number of contact vias. This leads to a high value of $C_{f1}$.

With the present invention, fewer contact vias are used than recommended by the design rules, which reduces the effective value of W and reduces $C_{f1}$. A portion 126 of a terminal B contact region in a layout used for a varactor in accordance with the present invention is shown in FIG. 13. Region 126 may correspond to a segment of a strip-shaped contact region such as region 60 in FIG. 5. (Contact regions 62 and 58 also have corresponding contacts, but those contacts do not significantly impact $C_{f1}$.)

In region 126, contact holes are formed through the surface insulating layer and allow respective vias 124 of conductor 48 to penetrate to n+ region 46 (FIG. 4). Each contact via 124 may have the same dimensions as a contact 122 in the conventional arrangement of FIG. 12, but there are fewer contact vias 124 per unit length. In the example of FIG. 13, there are only three contact vias 124 per micron, which is less than the five contact vias per micron permitted by the CMOS fabrication process design rule (in this example). By reducing the number of contacts 124 in the contact region used to form the terminal B contacts with the n-well, the capacitive coupling between the terminal B and terminal A electrodes (FIG. 4) is reduced. This reduces $C_{f1}$ and improves performance.

Another way to reduce $C_{f1}$ is to increase the value of d. In conventional varactor designs, the minimum possible spacing d that is permitted by the semiconductor fabrication process design rules is used. In accordance with the present invention, a separation d that is larger than the design rule separation is used, which helps to reduce $C_{fl}$.

Figure 14:
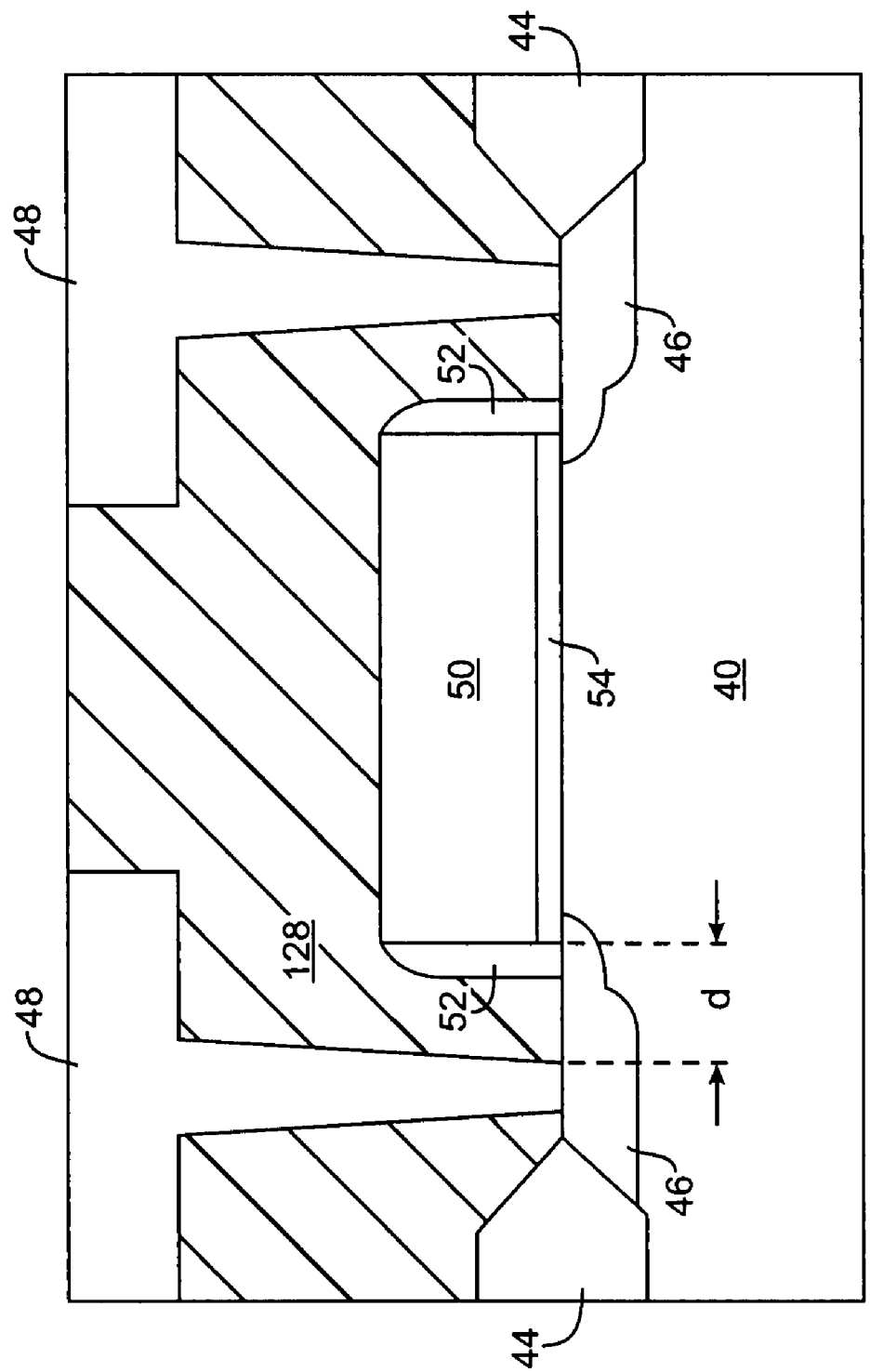
FIG. 14 is a cross-sectional view of a MOS varactor showing how parasitic capacitances are reduced in accordance with the present invention.

The cross-sectional view of a varactor 36 in which an enlarged value of d has been used is shown in FIG. 14. Also shown in FIG. 14 is the insulating oxide 128 (having permittivity $\epsilon_{ox}$ from equation 3) that separates B contacts 48 and silicided polysilicon 50.

In general, the magnitude of $C_{fl}$ can be reduced by designing varactor 36 so that the distance d between the varactor electrodes is larger than specified by the CMOS fabrication design rules and by using fewer contact vias for the B terminal electrode than specified by the design rules. Both of these techniques can be used in the same varactor design, or a varactor design could incorporate only an increased d or only a decreased number of contact vias.

Varactors such as varactor 36 are preferably fabricated on a CMOS integrated circuit using the same CMOS semiconductor fabrication steps that are used to fabricate CMOS transistors elsewhere on the same integrated circuit. The processing compatibility between the structures used for varactors 36 and CMOS transistors allows improved varactors to be fabricated without adding special processing steps. Special processing steps such as extra implantation steps would add undesired complexity to the process flow and would likely be cost prohibitive.

Figure 15:
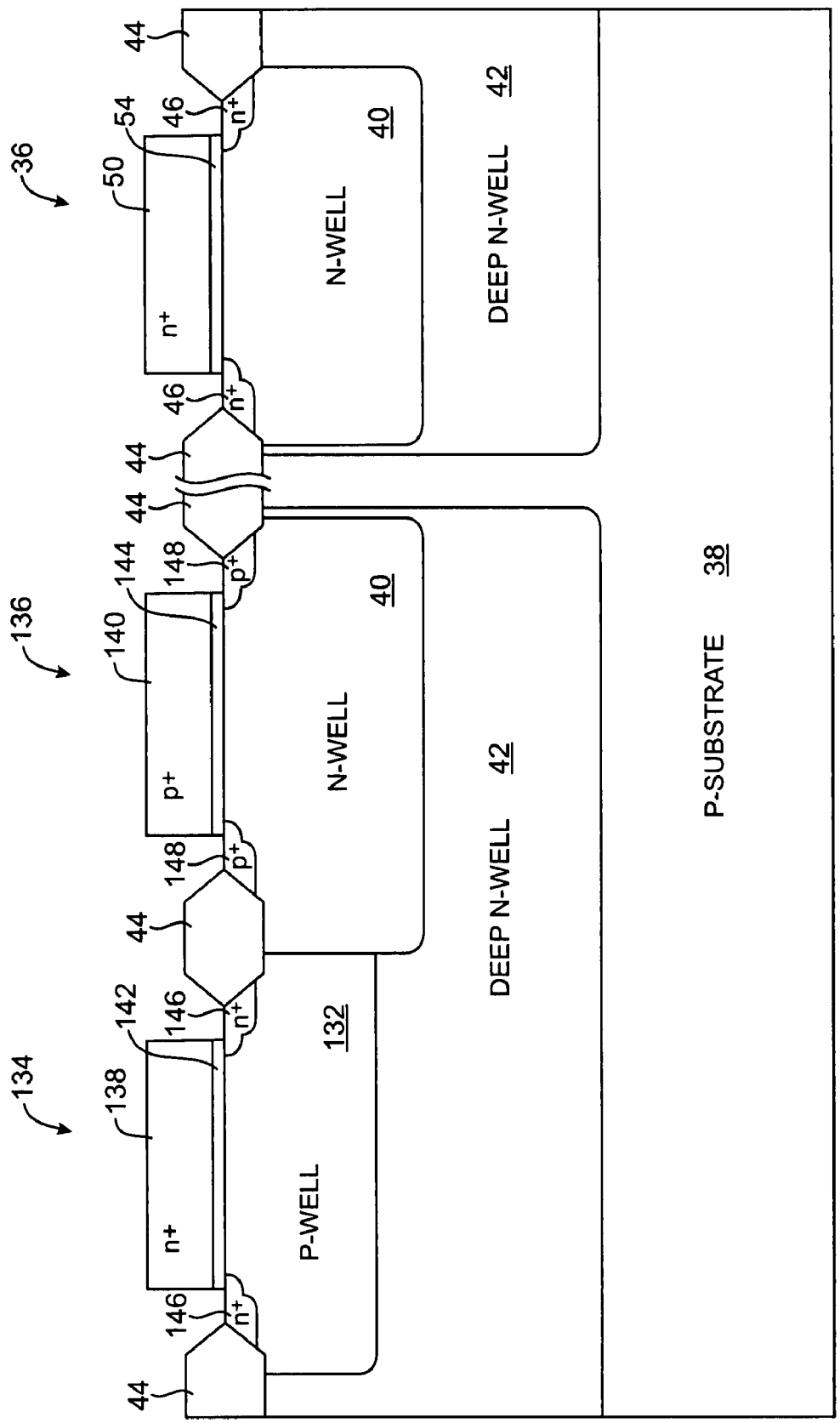
FIG. 15 is a cross-sectional view of a portion of an integrated circuit containing both a varactor and complementary MOS (CMOS) transistor devices formed using shared fabrication process steps in accordance with the present invention.

A cross-sectional side view of a portion of an integrated circuit 130 that contains both CMOS devices and a varactor 36 is shown in FIG. 15. The CMOS devices in integrated circuit 130 include n-channel metal-oxide-semiconductor (NMOS) transistor 134 and p-channel metal-oxide-semiconductor (PMOS) transistor 136. In a typical integrated circuit, there are numerous NMOS and PMOS transistors (referred to collectively as "CMOS" transistors). There are also one or more varactors 36. Transistors 134 and 136 and the other components on the integrated circuit reside on the same p-type substrate 38 as varactor 36. A common isolation oxide layer 44 is used for isolation by all devices in the circuit 130.

The structures of varactor 36 are fabricated using the same CMOS semiconductor fabrication processes used to fabricate NMOS transistor 134 and PMOS transistor 136. For example, the deep n-well 42 that is part of varactor 36 is formed using the same ion-implantation step used to form the CMOS deep n-well 42 underlying transistors 134 and 136. The deep n-well layer that forms the deep n-wells is a well-known CMOS structure and is available in standard CMOS fabrication process offerings. As another example, the gate oxide layer 142 of NMOS transistor 134 and the gate oxide layer 144 of PMOS transistor 136 are formed using the same thermal oxide growth fabrication step that is used to form oxide layer 54 in varactor 36.

Not all structures in PMOS transistor 134 and NMOS transistor 136 are shared with varactor 36. For example, NMOS transistor 134 has a p-well 132, rather than an n-well 40. PMOS transistor 136 and varactor 36 each have an n-well 40 that is formed from the same n-well layer, but do not have a p-well region. PMOS transistor 136 and varactor 36 are masked off during the p-type implantation step used to form p-well 132 for NMOS transistor 134. Similarly, PMOS transistor 136 has p+ regions 148 and a p+ polysilicon layer 140, which are not shared with varactor 36.

Varactor 36 has n+ regions 46. These regions are used to form ohmic contacts to B-terminal contact vias 48 (FIG. 4). The n+ regions 46 of varactor 36 are formed using the same n+ implantation steps that are used to form the source-drain n+ contact regions 146 for the sources and drains of NMOS transistors such as NMOS transistors 134. Prior to implantation for forming n+ regions 46 and 146 and the other implantation regions of circuit 130, holes are opened in a covering mask layer. The regions where the holes have been opened permit n-type dopant ions to strike the semiconductor surface. The lithographic mask patterns that are used to define the lateral dimensions of varactor 36 are different from the lithographic mask patterns that are used to define the lateral dimensions of transistors 134 and 136. However, the semiconductor fabrication steps (implantation, etching, planarization, deposition, oxide growth, metallization, cleaning, annealing, etc.) are the same for the CMOS devices on circuit 130 and the varactor(s) 36 on circuit 130.

Figure 16:
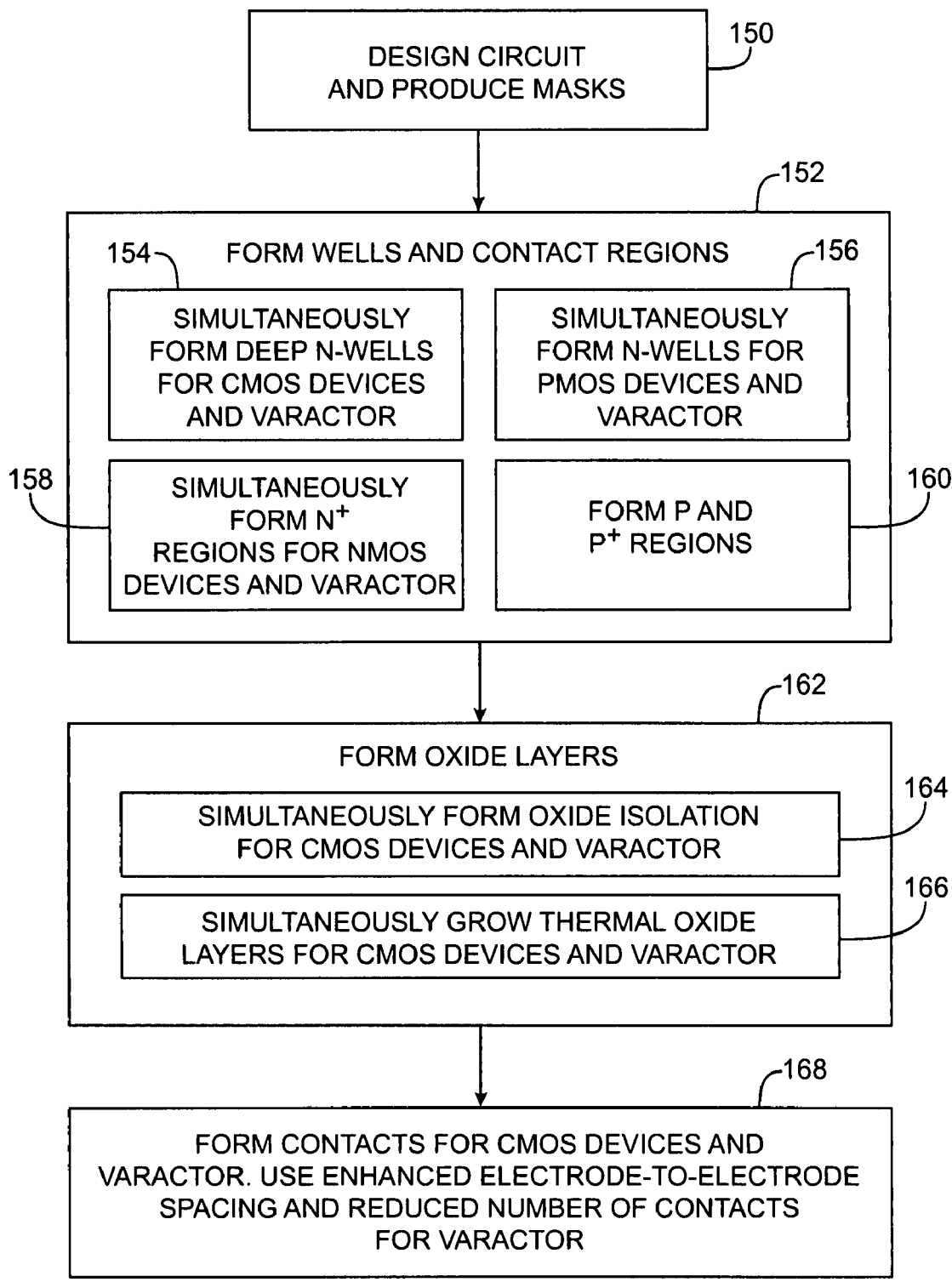
FIG. 16 is a flow chart of illustrative steps involved in fabricating an integrated circuit containing CMOS transistors and MOS varactors in accordance with the present invention.

Illustrative steps involved in forming MOS varactors 36 on an integrated circuit containing CMOS devices are shown in FIG. 16.

At step 150, a circuit designer designs the integrated circuit. In designing the integrated circuit, lithographic masks are created that are compatible with an established CMOS semiconductor fabrication process. For example, lithographic masks are created that have line widths that are not too small to be fabricated using the desired fabrication process. The design restrictions imposed by the fabrication process are referred to as design rules.

Computer-aided design (CAD) tools are used during step 150 to assist the circuit designer in producing a design that is compliant with the design rules. During the design phase, the circuit designer and/or the CAD tools create specifications for lithographic mask sets that have suitable layouts for varactors 36. For example, the patterns in the mask sets can be adjusted to ensure that the lateral spacing d between the terminal A and terminal B electrodes of the varactor is more than the minimum size specified by the semiconductor fabrication process design rules. The mask set patterns can also be adjusted to ensure that the number of terminal B contact vias used per unit length in the terminal B electrode is less than the maximum number specified by the semiconductor design rules. By using more contacts for the B terminal than specified by the design rules and by using an enhanced lateral spacing between electrodes, parasitic capacitances due to fringing fields can be minimized. After the design phase is complete, lithographic masks are formed for use during subsequent semiconductor fabrication steps.

Fabrication is carried out at the wafer level. At the end of the fabrication process, each silicon wafer is diced up to produce numerous completed integrated circuits. Each integrated circuit is packaged separately for use in a system. The wafer fabrication process includes steps 152, 162, and 168. During step 152, doped regions are formed in the silicon substrate. During step 162, oxide layers are formed. During step 168, contacts are formed. These steps are shown as being performed in series, but this is merely illustrative. The fabrication operations involved in the steps of FIG. 16 may be performed simultaneously or in any suitable order.

Step 152 involves forming doped regions in the silicon wafer. With modern CMOS processes, the doped structures for integrated circuit 130 are generally formed by ion implantation. During implantation operations, the lithographic mask sets from step 150 are used to pattern mask layers on a silicon wafer. Ions are then implanted into the wafer. The patterned implant masks allow ions to penetrate the silicon substrate at certain desired locations During step 154, deep n-wells 42 are formed by implanting n-type dopant ions in a deep n-well layer. The same ion-implantation step is used to implant the n-type dopant for the deep n-well 42 underlying the CMOS transistors and the deep n-well 42 underlying the varactor 36. As a result, the deep n-wells 42 are formed simultaneously for both the CMOS transistors 136 and 134 and varactor 36.

During step 156, an n-type ion implantation step is performed that forms an n-well layer. This simultaneously forms the n-wells 40 for both the varactor 36 and the PMOS transistor 136.

The n+ regions 146 for the NMOS transistor 134 and the n+ regions 46 for the varactor 36 are formed simultaneously during the same ion implantation step (step 158).

During the doping operations of step 152, p-type implants are used to form the p-well 132 and the p+ regions 148 (step 160).

During step 162, oxide layers or other suitable insulating layers are formed. The insulating layers may be formed from a single material (e.g., silicon dioxide, silicon oxynitride, silicon nitride, etc.) or may be formed from multiple layers of materials. The insulating layer formation steps include an oxide layer deposition step that simultaneously forms the insulating regions 44 for both the CMOS devices and the varactor (step 164). During step 166, a thermal oxide layer is grown. The thermal oxide layer that is grown serves as the oxide layer 54 in the varactor 36, the gate oxide layer 144 in PMOS transistor 136, and the gate oxide layer 142 in the NMOS transistor 134.

Step 168 involves contact formation for the gates, drains, and sources of the CMOS transistors and terminals A, B, and SUB for the varactors on integrated circuit 30. Contact electrodes are formed from conductive materials such as metal, silicided doped polysilicon (e.g., for a simultaneously-formed layer serving as varactor electrode 50 and gate electrodes 138 and 140), combinations of polysilicon and metal, layered metals, etc. In forming the contacts during step 168, the patterns of the mask sets defined in step 150 ensure that the spacing between the terminal A and terminal B electrodes is more than specified by the semiconductor fabrication process design rules. This spacing is shown as distance d in FIG. 14. Ensuring that d is larger than specified by the design rules reduces parasitic capacitance and improves varactor performance. During step 168, the number of contacts used for terminal B is preferably less than specified by the design rules. The terminal B electrode may, as an example, include numerous via holes filled with metal that contact the n+ doped regions 46. The vias may be square, as shown in the plan view of terminal B contact region 30 in FIGS. 2 and 3 and the plan view of the segment of the terminal B contact region 126 in FIG. 13. As shown in FIG. 13, fewer contact vias 124 are formed for the electrode per unit length along the longitudinal axis of the electrode than specified by the semiconductor fabrication design rules. This reduces the amount of electric field coupling between terminal B and terminal A, which reduces parasitic capacitance and improves varactor performance.

The foregoing is merely illustrative of the principles of this invention and various modifications can be made by those skilled in the art without departing from the scope and spirit of the invention.

What is claimed is:

1. A metal-oxide-semiconductor integrated circuit varactor comprising:
    a p-substrate;
    a deep n-well formed in the p-substrate;
    an n-well formed in the deep n-well;
    an n+ region formed in the n-well;
    an oxide layer formed on the n-well;
    a first electrode formed on the oxide layer; and
    a second electrode formed on the n+ region,
wherein at least a portion of the second electrode forms a strip having a longitudinal dimension and wherein semiconductor fabrication process design rules specify a maximum value indicating how many contact vias may be formed in the strip per unit length along the longitudinal dimension, the metal-oxide-semiconductor integrated circuit varactor further comprising:
    a plurality of contact vias in the second electrode, wherein the plurality of contact vias make electrical contact with the n+ region, and wherein there are fewer contact vias per unit length along the longitudinal dimension than specified by the maximum value.

2. A metal-oxide-semiconductor integrated circuit varactor comprising:
    a p-substrate;
    a deep n-well formed in the p-substrate;
    an n-well formed in the deep n-well;
    an n+ region formed in the n-well;
    an oxide layer formed on the n-well;
    a first electrode formed on the oxide layer; and
    a second electrode formed on the n+ region,
wherein the integrated circuit varactor is fabricated according to semiconductor fabrication process design rules and wherein the design rules specify a minimum distance for spacing the first electrode from the second electrode, the metal-oxide-semiconductor integrated circuit varactor further comprising insulator that separates the first electrode from the second electrode by more than the minimum distance specified in the design rules.

3. A metal-oxide-semiconductor integrated circuit varactor comprising:
    a p-substrate;
    a deep n-well formed in the p-substrate;
    an n-well formed in the deep n-well;
    an n+ region formed in the n-well;
    an oxide layer formed on the n-well;
    a first electrode formed on the oxide layer; and
    a second electrode formed on the n+ region,
wherein at least a portion of the second electrode forms a strip having a longitudinal dimension and wherein semiconductor fabrication process design rules specify a maximum value indicating how many contact vias may be formed in the strip per unit length along the longitudinal dimension and specify a minimum distance for spacing the first electrode from the second electrode, the metal-oxide-semiconductor integrated circuit varactor further comprising:
    a plurality of contact vias in the second electrode, wherein the plurality of contact vias make electrical contact with the n+ region, and wherein there are fewer contact vias per unit length along the longitudinal dimension than specified by the maximum value; and
    insulator that separates the first electrode from the second electrode by more than the minimum distance specified in the design rules.

4. An integrated circuit, comprising:
    a deep n-well layer;
    an n-well layer formed in the deep n-well layer;
    an n-channel metal-oxide-semiconductor transistor and a p-channel metal-oxide-semiconductor transistor formed from a first portion of the deep n-well layer, wherein the n-channel metal-oxide-semiconductor transistor has a p-well formed in the first portion of the deep n-well layer and wherein the p-channel metal-oxide-semiconductor transistor has an n-well formed from a portion of the n-well layer in the first portion of the deep n-well; and a varactor formed from a second portion of the deep n-well layer, wherein the varactor has an n-well formed from a portion of the n-well layer in the second portion of the deep n-well layer.

5. The integrated circuit defined in claim 4, wherein the integrated circuit is fabricated according to semiconductor fabrication process design rules, the integrated circuit further comprising:

an oxide layer formed on the n-well in the varactor;
a first electrode formed on the oxide layer in the varactor;
an n+ region in the n-well in the varactor; and
a second electrode formed on the n+ region, wherein the second electrode contains a plurality of contact vias and wherein there are fewer contact vias per unit length in the second electrode than permitted by the design rules.

6. The integrated circuit defined in claim 4, wherein the integrated circuit is fabricated according to semiconductor fabrication process design rules, the integrated circuit further comprising:

an oxide layer formed on the n-well in the varactor;
a first electrode formed on the oxide layer in the varactor;
an n+ region in the n-well in the varactor; and
a second electrode formed on the n+ region at a distance from the first electrode that is more than a minimum electrode-to-electrode spacing specified by the design rules, wherein the second electrode contains a plurality of contact vias and wherein there are fewer contact vias per unit length in the second electrode than permitted by the design rules.

7. The integrated circuit defined in claim 4, wherein the integrated circuit is fabricated according to semiconductor fabrication process design rules, the integrated circuit further comprising:

an oxide layer formed on the n-well in the varactor;
a first electrode formed on the oxide layer in the varactor;
an n+ region in the n-well in the varactor; and
a second electrode formed on the n+ region at a distance from the first electrode that is more than a minimum electrode-to-electrode spacing specified by the design rules.

* * * * *